(12) United States Patent
Kanskar

(10) Patent No.: US 11,063,404 B1
(45) Date of Patent: Jul. 13, 2021

(54) BIDIRECTIONALLY EMITTING SEMICONDUCTOR LASER DEVICES

(71) Applicant: nLIGHT, Inc., Vancouver, WA (US)

(72) Inventor: Manoj Kanskar, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 16/570,297

(22) Filed: Sep. 13, 2019

Related U.S. Application Data

(60) Provisional application No. 62/730,886, filed on Sep. 13, 2018.

(51) Int. Cl.
*H01S 5/10* (2021.01)
*H01S 5/026* (2006.01)
(Continued)

(52) U.S. Cl.
CPC ............ *H01S 5/0262* (2013.01); *H01L 33/04* (2013.01); *H01S 5/0653* (2013.01);
(Continued)

(58) Field of Classification Search
CPC .... H01S 5/0262; H01S 5/2018; H01S 5/0653; H01S 5/4068; H01S 5/1021; H01S 5/0287; H01S 5/34; H01L 33/04
See application file for complete search history.

(56) References Cited

U.S. PATENT DOCUMENTS

| 5,631,916 A | 5/1997 | Georges et al. |
| 9,166,369 B2 | 10/2015 | Kanskar |

(Continued)

FOREIGN PATENT DOCUMENTS

| IT | 0001426562 B1 | 12/2016 |
| WO | 9101056 A1 | 1/1991 |

(Continued)

OTHER PUBLICATIONS

Research Report and Written Opinion for Italian Application No. TO2014A000852, dated Jun. 18, 2015, 9 pages.

*Primary Examiner* — Xinning(Tom) Niu
(74) *Attorney, Agent, or Firm* — Stoel Rives LLP

(57) ABSTRACT

Disclosed are embodiments of bidirectionally emitting semiconductor (BEST) laser architectures including higher order mode suppression structures. The higher order mode suppression structures are centrally located and extend from an inner transition boundary, which may be established by confronting high reflector (HR) facets in some embodiments or a central plane defining two sides of a unitary, bidirectional optical cavity in other embodiments. Examples of the higher order mode suppression structures include narrow regions of bidirectional flared laser oscillator waveguide (FLOW) devices, which are also referred to as reduced mode diode (REM) devices; high-index regions of bidirectional higher-order mode suppressed laser (HOMSL) devices; and non- or less-etched gain-guided lateral waveguides of bidirectional low divergence semiconductor laser (LODSL) devices. The aforementioned devices may also include scattering features, distributed feedback (DFB) gratings, distributed Bragg reflection (DBR) gratings, and combination thereof that also act as supplemental higher order mode suppression structures.

12 Claims, 13 Drawing Sheets

(51) Int. Cl.
*H01S 5/40* (2006.01)
*H01L 33/04* (2010.01)
*H01S 5/065* (2006.01)
*H01S 5/20* (2006.01)
*H01S 5/34* (2006.01)
*H01S 5/028* (2006.01)

(52) U.S. Cl.
CPC .......... *H01S 5/1021* (2013.01); *H01S 5/2018* (2013.01); *H01S 5/4068* (2013.01); *H01S 5/0287* (2013.01); *H01S 5/34* (2013.01)

(56) References Cited

U.S. PATENT DOCUMENTS

| | | | |
|---|---|---|---|
| 9,214,786 | B2 | 12/2015 | Hemenway et al. |
| 9,647,416 | B2 | 5/2017 | Demir et al. |
| 2006/0193353 | A1* | 8/2006 | Kim .......................... H01S 5/22 372/19 |
| 2009/0097511 | A1 | 4/2009 | Mohrdiek et al. |
| 2012/0002395 | A1 | 1/2012 | Du et al. |
| 2014/0219305 | A1* | 8/2014 | Fang ...................... H01S 5/1082 372/45.01 |
| 2014/0301421 | A1* | 10/2014 | Kanskar ................ H01S 5/0287 372/46.01 |
| 2016/0344160 | A1* | 11/2016 | Muller .................. H01S 5/4025 |
| 2018/0035877 | A1 | 2/2018 | Kinouchi et al. |
| 2018/0123317 | A1 | 5/2018 | Kanskar et al. |
| 2018/0358777 | A1 | 12/2018 | Chen et al. |

FOREIGN PATENT DOCUMENTS

| | | |
|---|---|---|
| WO | 2006105249 A2 | 10/2006 |
| WO | 2007004726 A1 | 1/2007 |
| WO | 2011108038 A1 | 9/2011 |

* cited by examiner

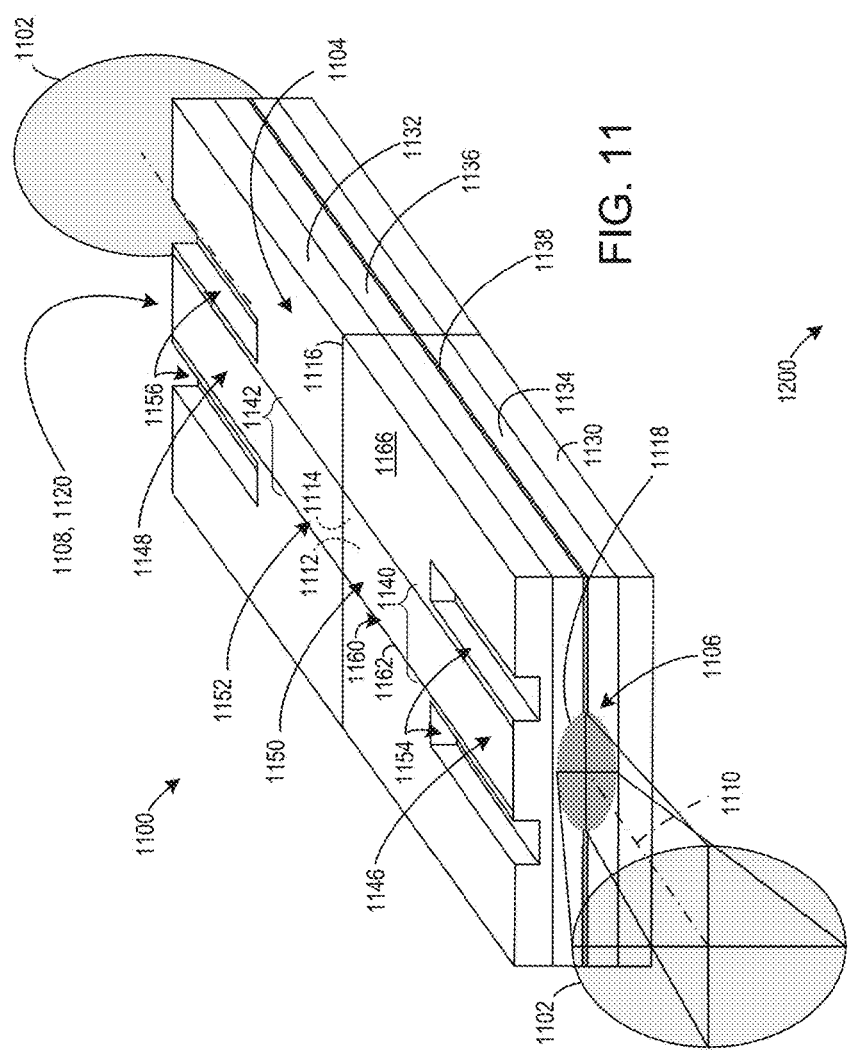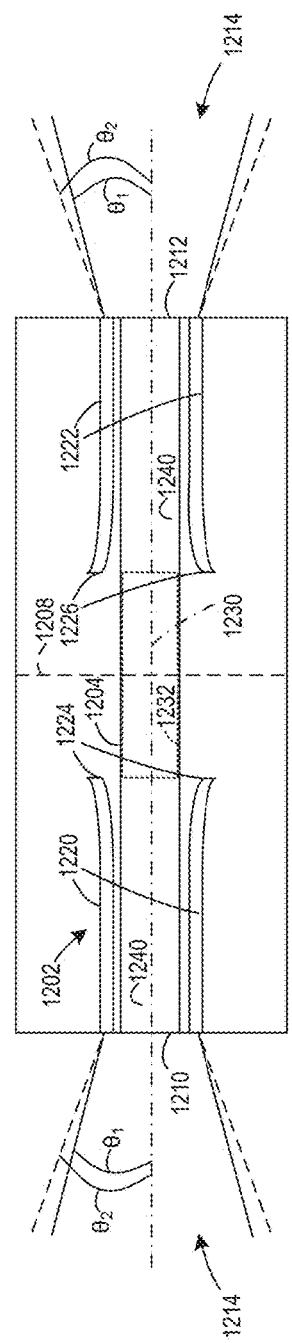

| Left | Right | FLOW - I | FLOW - II | Nomenclature |
|---|---|---|---|---|
| Straight | Straight | x | | (0 0) |
| + Curve | + Curve | x | | (+ +) |
| - Curve | - Curve | x | | (- -) |
| Straight | + Curve | | x | (0 +) |
| Straight | - Curve | | x | (0 -) |
| + Curve | - Curve | | x | (+ -) |
| + S Curve | + S Curve | | x | (s+ s+) |
| - S Curve | - S Curve | | x | (s- s-) |
| + S Curve | - S Curve | | x | (s+ s-) |
| Straight | + S Curve | | x | (0 s+) |
| Straight | - S Curve | | x | (0 s-) |
| + S Curve | + Curve | | x | (s+ +) |
| + S Curve | - Curve | | x | (s+ -) |
| - S Curve | + Curve | | x | (s- +) |
| - S Curve | - Curve | | x | (s- -) |

FIG. 22

BIDIRECTIONALLY EMITTING SEMICONDUCTOR LASER DEVICES

RELATED APPLICATION

This application claims priority benefit of U.S. Provisional Patent Application No. 62/730,886, filed Sep. 13, 2018, which is hereby incorporated by reference.

TECHNICAL FIELD

This disclosure relates to laser diodes and broad area lasers (BALs) and, in particular, to higher order mode suppression structures for bidirectionally emitting laser devices.

BACKGROUND INFORMATION

Light emission in a laser occurs as a result of optical amplification by stimulated emission of electromagnetic radiation. Some lasers emit spatially and temporally coherent light in a narrow light bandwidth that can be narrowly focused over long distances. There are a wide variety of lasers, for example, gas lasers, chemical lasers, dye lasers, metal-vapor lasers, solid-state lasers, and semiconductor lasers. Laser diodes are electrically pumped semiconductor lasers, in which an active layer is formed by a p-n junction of a semiconductor diode. Laser diodes typically comprise an active layer disposed between a p-type layer of semiconductor material and an n-type layer of semiconductor material. Many laser diodes are fabricated on a semiconductor substrate such as gallium arsenide, doped with elements such as aluminum, silicon, zinc, carbon or selenium to produce the n- and p-type semiconductor layers. The active layer is typically un-doped gallium-indium-arsenide and may be only a few nanometers thick.

Laser diodes are formed by growing multiple layers of semiconductor materials on a suitable substrate with a lattice constant that allows choice of materials to produce desired emission wavelengths. A typical laser diode comprises n-type layers, p-type layers and an undoped active layer between them such that when the diode is forward-biased, electrons and holes recombine in the active region layer to produce light. The active layer (quantum well(s), quantum wire(s) or quantum dots, type-II quantum well(s)) resides in a waveguide layer which has a higher index of refraction compared to those of the surrounding p- and n-doped cladding layers. Light generated from the active layer is confined in the plane of the waveguide.

Multimode laser diodes are also known as BALs. A conventional edge-emitting Fabry Perot BAL diode is arranged as a rectangular gain or index-guided semiconductor structure. Opposing end facets of the waveguide define high and partial reflectors to provide feedback for oscillation of light within the resonator. The multi-layered laser diode structure extends the length of the laser and has a broad width for electrical injection extending to opposite side surfaces, which also extend the length of the laser.

The multi-layered semiconductor materials are typically arranged so that the laser operates in a single mode along the growth direction, and this direction is defined as the fast-axis or transverse direction. Since the semiconductor laser operates in a single mode along the fast-axis direction, the brightness of laser diode in this direction cannot be improved any further—it is so called diffraction-limited. The distance between the top and bottom surfaces of the multi-layered semiconductor laser structure thus provides the smaller dimension of the end facets, i.e., the thickness of the stripe, typically on the order of microns.

On the other hand, the width of the multi-layered laser structure provides the larger dimension of the end facets, i.e., the stripe-width is typically on the order of many tens of microns to hundreds of microns. This is referred to as the slow axis or lateral direction. Because the stripe width is much larger than the wavelength of light, the lateral property of an optical field propagating along the optical axis of the waveguide is highly multimode along the wider stripe dimension and the corresponding axis is described as slow-axis because the divergence angle is much smaller relative to the fast axis divergence angle.

Maximum output of conventional high power semiconductor lasers has been limited to rollover power levels of 20 to 25 watts (W) for broad-area 100 micrometer ($\mu$m) wide lasers under continuous wave (CW) room temperature conditions. Semiconductor lasers and semiconductor laser-based devices having improved output optical power and output efficiency are desired. Although semiconductor material growth quality and laser design have reached a high maturity, further improvements to chip performance providing an increase in the power from a semiconductor laser chip remain challenging. For power-scaling applications and reducing the cost-per-watt of producing laser diodes, higher brightness at higher output power per emitter is desirable.

SUMMARY OF THE DISCLOSURE

Described are bidirectionally emitting semiconductor (BESt, or BEST) laser architectures having a centrally located region (proximal an inner transition boundary) defining higher order mode suppression structures, according to the aforementioned embodiments. BEST devices may be deployed in a chip on submount formation, in which the chip include a single optical cavity or two optical cavities.

A BEST laser diode device for bidirectional emission of first and second laser beams along opposite propagation directions includes a waveguide body having first and second portions and one or more optical cavities, each of the first and second portions of the waveguide body including an outer face and an inner transition boundary between the first and second portions, the outer faces of the first and second portions including, respectively, first and second partial reflector (PR)-coated laser output facets facing in opposing directions on opposite sides of the waveguide body for the bidirectional emission of the first and second laser beams from the one or more optical cavities, and the inner transition boundaries of the first and second portions disposed adjacent to each other and to a central plane dividing the first and second portions along a longitudinal length of the waveguide body; and first and second higher order mode suppression structures formed in the waveguide body and extending away from the inner transition boundaries in a direction along the longitudinal length, each of the first and second higher order mode suppression structures disposed along at least a corresponding portion of the waveguide body that is offset laterally from the one or more optical cavities so as to impart intensity control, beginning at the inner transition boundaries and differing longitudinally with respect to that imparted toward the outer faces, of a mode profile that is lateral to the opposite propagation directions of the first and second laser beams, thereby facilitating enhanced slow axis brightness.

Additional aspects and advantages will be apparent from the following detailed description of embodiments, which proceeds with reference to the accompanying drawings.

BRIEF DESCRIPTION OF THE DRAWINGS

FIGS. 11 and 12 are, respectively, isometric and top plan views of two optical cavity designs of low divergence semiconductor laser (LODSL) devices.

FIG. 22 is a table showing additional details on different types and combinations of tapered lateral waveguide shapes.

DETAILED DESCRIPTION OF EMBODIMENTS

BALs have the property that their slow-axis beam-parameter-product (BPP) and their slow-axis brightness (power÷BPP) degrade progressively when they are driven at higher current to generate higher power. Brightness can be improved in BALs by reducing the emitter width; however, electrical current at which the maximum brightness occurs progressively decreases for decreasing emitter widths. Hence, maximum output power at the maximum brightness also drops.

Another technique for increasing brightness entails providing a longer length of an optical cavity in a device. The applicant, nLIGHT, Inc. of Vancouver, Wash., has demonstrated that slow-axis brightness improves at a fixed BPP when an optical cavity length is increased from 3.8 millimeters (mm) to 5 mm and still further to 6 mm. But as the chip length is increased, the external differential quantum efficiency, i.e., the so called slope efficiency, degrades due to roundtrip loss in the cavity due to longitudinal spatial intensity variation. Thus, progressively increasing the cavity length provides diminishing returns.

To address the aforementioned shortcomings, this disclosure describes devices in which laser beams emanate in opposite directions from opposing facets. Such a device is referred to as a BEST laser. The BEST laser architecture provides advantages when deployed in new styles of fiber-coupled modules that are the subject of U.S. Provisional Patent Application No. 62/776,311 of Kanskar, titled "Diode Laser Package for Bidirectionally Emitting Semiconductor Laser Devices," filed Dec. 6, 2018 by nLIGHT, Inc.: part count is decreased and the package width is narrower for packages with integrated cooling plenum. Thus, the BEST laser architecture facilitates low SWAP fiber-coupling packages having lower part count and simpler cooling techniques when integrated single phase or two-phase cooling methods are used. The reason for this is two laser diode chips, or one chip that is two times longer, can be put on a single submount and heatsink. As a result, the number of parts (part count) goes down, not necessarily the total amount of material used. This cuts down on bonding and die attach process steps by a factor of two.

For unidirectionally emitting semiconductor applications, low SWAP laser diode (LSLD) assemblies including chip on submount (COS) components have been described in U.S. patent application Ser. No. 15/498,422 of Kanskar et al., titled "Low Size and Weight, High Power Fiber Laser Pump," filed Apr. 26, 2017 by nLIGHT, Inc. For conciseness, therefore, the following paragraphs describe how the BEST laser architecture shown in FIGS. 1-4 is employed in new LSLD assemblies including COS formations, according to two embodiments. FIGS. 5-21 then show additional examples of different types of higher order mode suppression structures available for use in devices of FIGS. 1-4 so as to address effects of longitudinal spatial hole burning (LSHB) or otherwise enhance performance.

Figure 1:
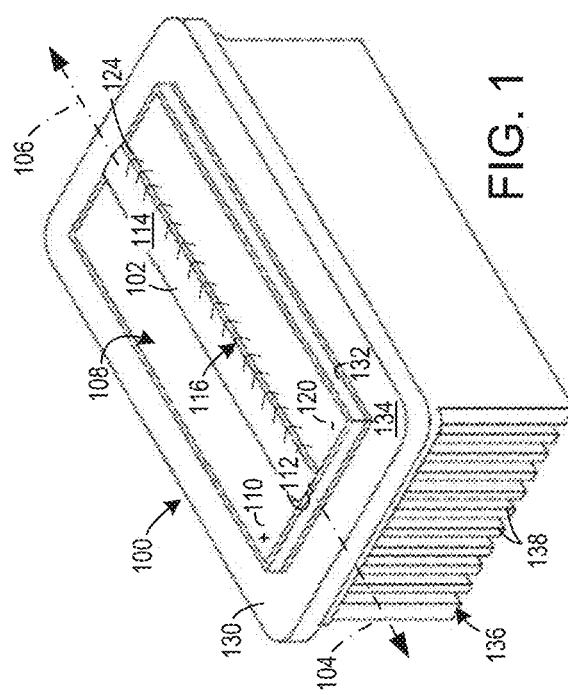
FIGS. 1 and 2 are, respectively, isometric and top plan views of a first chip on submount (COS) formation deployed in a low size and weight and power efficient (SWAP) laser diode assembly implementation of a bidirectionally emitting semiconductor (BESt, or BEST) laser architecture, according to a first embodiment having a single optical cavity.

FIG. 1 shows a first LSLD assembly 100 including a semiconductor laser diode 102 (or simply, laser diode 102) for bidirectional emission of first and second laser beams 104, 106 along opposite propagation directions. According to a COS formation shown in FIG. 1, laser diode 102 is carried atop, and is electrically coupled to, a submount 108 such that current flows from a positive contact pad 110 of submount 108, into a lower surface 112 of laser diode 102 electrically coupled to positive contact pad 110 that extends under lower surface 112 (laser diode 102 is oriented such that the A-side of a p-n junction is closest to lower surface 112), through a waveguide body having an optical cavity and active region (described later), up through the p-n junction, away from an upper surface 114 of laser diode 102, and out through wire bonds 116 electrically coupled between an n-side of laser diode 102 and a negative contact pad 120 of submount 108. Contact pads 110 and 120 of submount 108 remain electrically isolated from each other by an isolation gap 124 of submount 108, and lower surface 112 does not itself bridge gap 124.

Submount 108 may be made of a variety of materials such as silicon carbide (SiC), chemical vapor deposition (CVD) diamond, copper (Cu), aluminum nitride (AlN), cubic boron nitride (c-BN), graphite, graphene, graphene-composites, carbon nanotubes, carbon nanotube composites, diamond or encapsulated pyrolytic graphite, or the like or any combinations thereof. Submount 108 is carried atop, and electrically isolated from, a heatsink 130. For example, a relatively thin heat-transfer layer 132 of submount 108 electrically isolates pads from a top cooling surface 134 of heatsink 130 and yet is a thermally conductive material that may be different from or the same as that of top cooling surface 134 of heatsink 130.

Heatsink 130 may comprise any of a variety of materials such as aluminum silicon carbide (AlSiC), pyrolytic graphite, copper (Cu), aluminum (Al), or the like or any combinations thereof. Heatsink 130 includes a plurality of heat-transferring members 136 for removing heat generated by laser diode 102. According to some embodiments, heat-transferring members 136 comprise fins 138. In other embodiments, heat-transferring members 136 comprise any of a variety of structures having a high surface-to-volume ratio configured for efficient heat transfer. Such structures include fins 138, posts, pegs, structures having textured surfaces (e.g., dimpled surfaces), or porous structures (e.g., graphite foam or micro-porous copper (Cu)), structures constructed using additive manufacturing to optimize surface-to-volume ratio with topological functional optimization, or the like or any combinations thereof. It is possible to reduce a conventional copper heatsink mass by about ≥30%, for example, from a current 1.94 g to ≤1.40 g per heatsink. This may amount to 30% reduction in heatsink mass and 0.27 g/W specific mass for the total package. Additionally, the thermal transfer coefficient may reduce to, at least, double resulting in about 1% improvement in efficiency.

Figure 2:
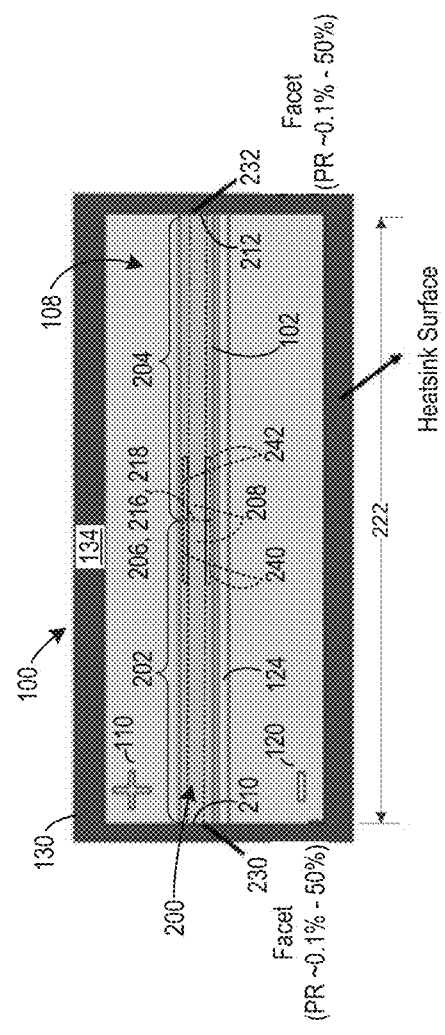

With respect to the aforementioned bidirectionality, FIG. 2 shows (with wire bonds 116 omitted for clarity) that LSLD assembly 100 includes a single, relatively long laser diode 102 chip—e.g., about at least two times a length of a typical optical cavity, 2×L(cavity)—for producing a total of about twice the optical power. Specifically, a waveguide body 200 includes first and second portions 202, 204 (e.g., demarcated by a phantom line showing a location of a common inner transition boundary 206) and one or more optical cavities 208 that are internal and within an electrically injected region, see e.g., FIGS. 5-21.

Figure 3:
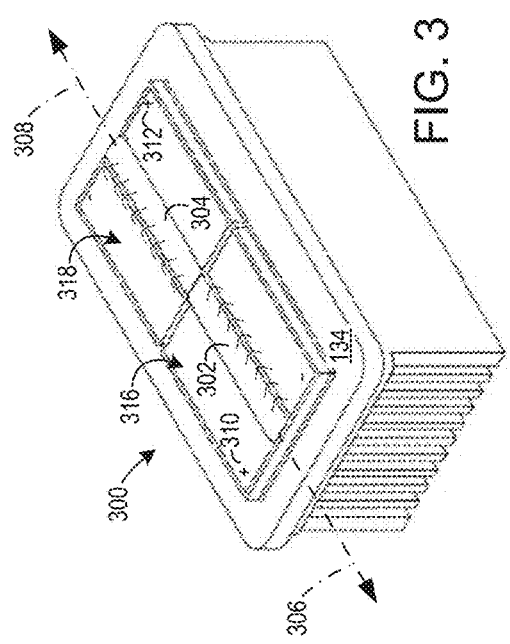
FIGS. 3 and 4 are, respectively, isometric and top plan detail views of a second COS formation deployed in a low SWAP laser diode assembly implementation of a BEST laser architecture, according to a second embodiment having two, back-to-back Fabry Perot laser COS devices.
Figure 4:
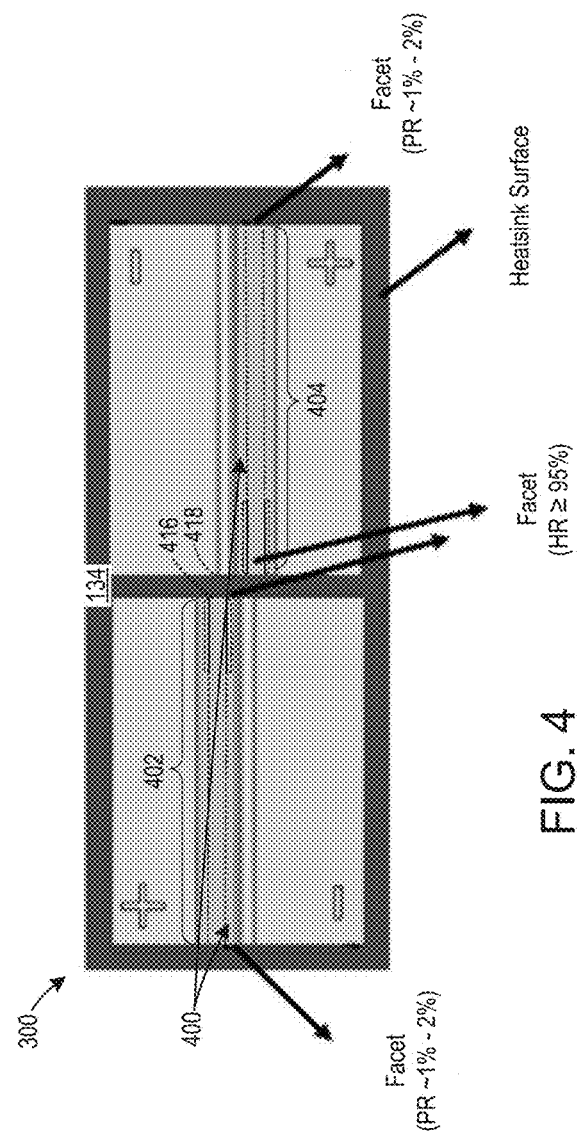

An inner transition boundary defines the longitudinal point at which an actual (i.e., in the case of BEST laser device) or effective (i.e., in the case of a back-to-back device) cavity length is split such that higher order mode suppression features (described later) extend along at least part of the lateral sides of the cavity (or cavities), from the boundary and toward corresponding output facets. In some embodiments, an inner transition boundary defines an axis of symmetry for higher order mode suppression structures, a laterally narrowest point of a bidirectional flared waveguide or back-to-back flared waveguides, or other types of divisions in waveguide spatial characteristics. For example, in the embodiment of FIGS. 1 and 2, inner transition boundaries 216, 218 are coextensive with inner transition boundary 206 that represents a split between higher order mode suppression structures described later. Other embodiments, however, may include spaced apart (i.e., discrete) inner transition boundaries, as shown in FIGS. 3 and 4.

First and second portions 202, 204 of waveguide body 200 include, respectively, first and second outer faces 210, 212 and inner transition boundaries 216, 218 between first and second portions 202, 204. Inner transition boundaries 216, 218 are disposed adjacent to each other and to a central plane dividing first and second portions 202, 204 along a longitudinal length 222 of waveguide body 200.

Outer faces 210, 212 include, respectively, first and second partial reflector (PR)-coated laser output facets 230, 232 facing in opposing directions on opposite sides of waveguide body 200 for the bidirectional emission of first and second laser beams 104, 106 (FIG. 1) from one or more optical cavities 208. This arrangement is in contrast to conventional Fabry Perot laser devices in which a front facet is PR and another non-emitting back facet has a high reflector (HR) coating to recirculate power. In other words, laser diode 102 includes two front facets and no HR facet. As annotated in FIG. 2, the reflectivity of PR facets is in the range of about 0.1% to about 50%. The two PR reflectivity values can be asymmetric, if desired.

FIG. 2 also shows optional first and second higher order mode suppression structures 240, 242 formed in waveguide body 208 and extending away from inner transition boundaries 216, 218 in a direction along longitudinal length 222. Each of first and second higher order mode suppression structures 240, 242 is disposed along at least a corresponding portion of waveguide body 208 that is offset laterally from one or more optical cavities 200 so as to impart intensity control—beginning at inner transition boundaries 216, 218 and differing longitudinally with respect to intensity control imparted toward the outer faces 210, 212—of a mode profile that is lateral to the opposite propagation directions of first and second laser beams 104, 106, thereby facilitating enhanced slow axis brightness. In other words, control of a mode profile means reduction in lateral divergence angle or slow-axis divergence angle.

Specific examples of higher order mode suppression structures are described later with reference to bidirectional embodiments of nLIGHT, Inc.'s technology including FLOW devices, which are also referred to as reduced mode diode (REM) devices; HOMSL devices including high-index regions; and LODSL devices including non- or less-etched gain-guided lateral waveguides. Initially, however, the following paragraphs provide an overview of how these technologies provide additional advantages in the BEST laser architecture.

BPP is equal to an emitter width multiplied by divergence angle. Thus, for a given output emitter width, and due to lower divergence angles of FLOW/REM/LODSL/HOMSL devices, such devices have lower BPP than that of conventional BAL devices. As a result, wider output apertures are used in these architectures to achieve a BPP equivalent to that of a conventional device having a smaller aperture. And for the same BPP, bidirectionally emitting FLOW/REM/LODSL/HOMSL devices have a larger electrically pumped region, making them lower in electrical resistance and thermal resistance. Hence, they are more efficient at the same current density. Accordingly, for the same cavity length as a unidirectional device, bidirectionally emitting FLOW/REM/LODSL/HOMSL devices produce higher output power and efficiency without sacrificing BPP. Typically, when higher power is extracted from broad area devices of a fixed emitter width, facet power density goes up and impacts reliability of the laser. But FLOW/REM/LODSL/HOMSL devices can better maintain reliable facet power density and not diminish the lifetime of the device due to the larger emission output widths that are possible.

In the embodiment of FIGS. 1 and 2, first and second portions 202, 204 are halves of laser diode 102. Skilled persons will appreciate that, in other embodiments, first and second portions 202, 204 need not be equal halves, they may be asymmetrical. Likewise, laser beams 104, 106 need not be perfectly aligned along a substantially common optical axis. For example, FIGS. 3 and 4 show another LSLD assembly 300 that includes a pair Fabry Perot laser diodes 302, 304 deployed back-to-back (i.e., confronting HR facets) in COS formations to achieve an effective optical cavity length that is similar that of laser diode 102 (FIG. 1), i.e., about 2×L(cavity) or greater. Laser beams 306, 308 are slightly laterally offset from each other because lasers 302, 304 are each offset toward corresponding positive contact pad 310, 312 on spaced apart submounts 316, 318.

Fabry Perot laser diodes 302, 304 are carried on a common heatsink. A common heatsink is advantageous in ultra-low SWAP and efficient fiber laser (USE-FL) pump architecture because a single longer copper finned heatsink reduces the number of parts that would otherwise have to be brazed, which also reduces the total brazing surface area making it cheaper and easier to fabricate. Furthermore, the width of the overall package can also be reduced to improve SWAP, as described previously.

In terms of other differences compared to LSLD assembly 100, FIG. 4 also shows how a waveguide body 400 of device 300 includes separate laser diodes lasers 302, 304 such that a first portion 402 of waveguide body 400 corresponds to laser diode 302 and a second portion 404 of waveguide body 400 corresponds to laser diode 304. Thus, inner transition boundaries 416, 418 are slightly spaced apart, confronting, and coextensive with HR facets that are about 95% reflective, according to some embodiments. Finally, FIG. 4 also indicates that the range of PR reflectivity values are approximately 0.1% to 2%.

FLOW/REM in BEST Laser Architecture

Figure 5:
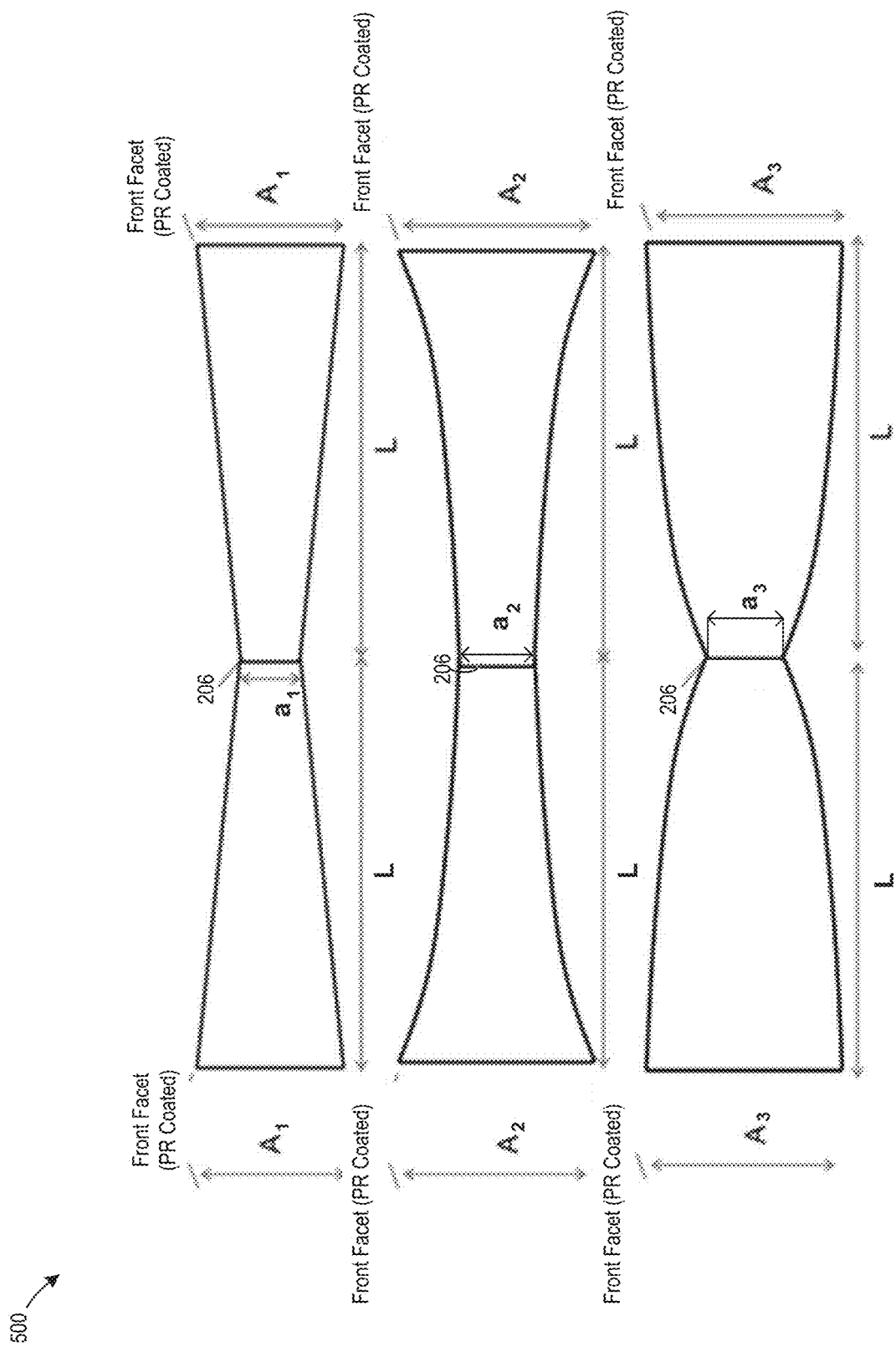
FIGS. 5 and 6 each show a set of three top plan views of bidirectional, flared laser oscillator waveguide (FLOW) optical cavity designs, in which the set of FIG. 5 shows a unitary waveguide body and the set of FIG. 6 shows a two-piece waveguide body.
Figure 6:
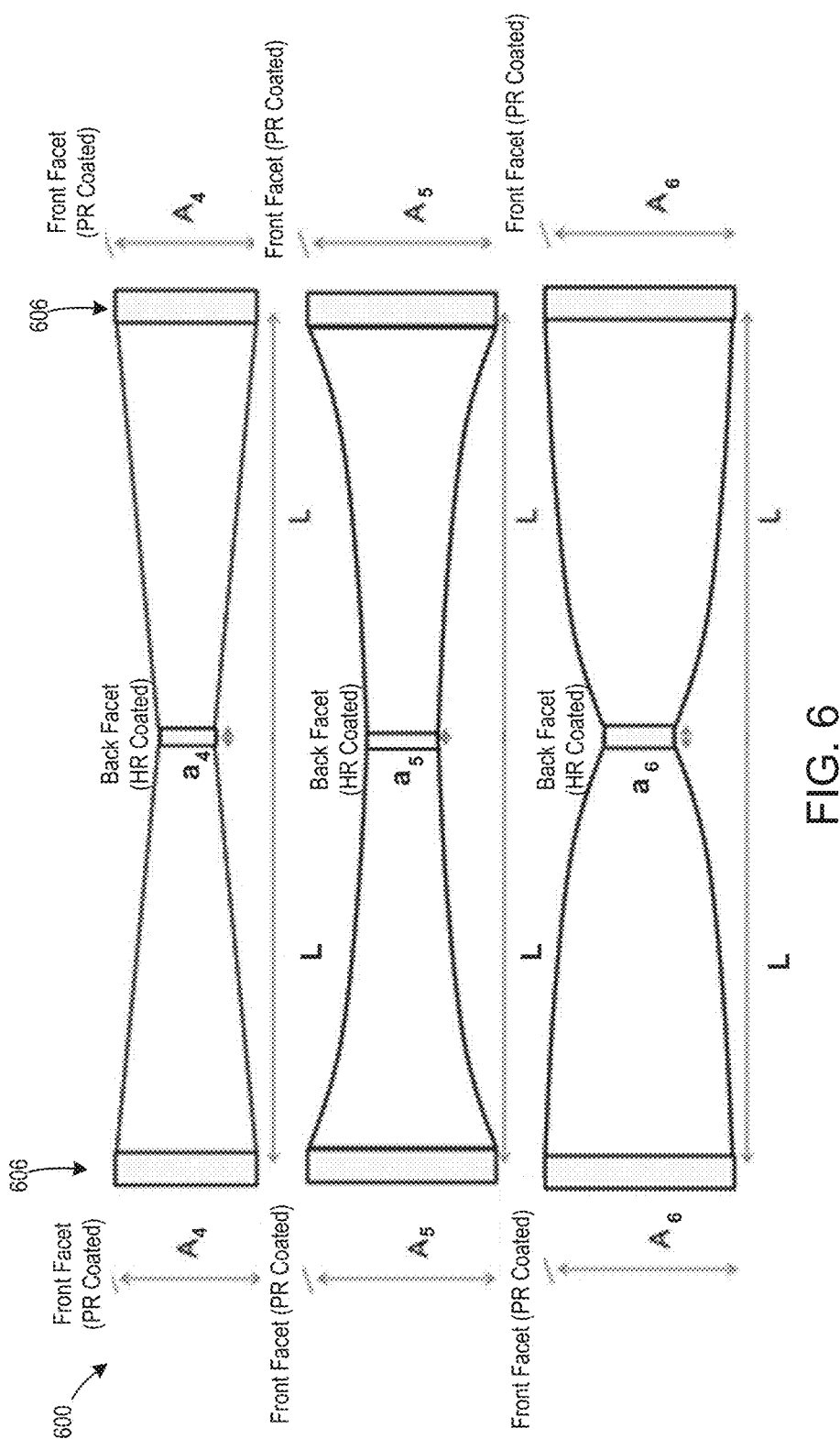

FIGS. 5 and 6 show, respectively, first and second sets of three flared BAL optical cavity design options. In a first set 500 of FIG. 5, optical cavity length is 2×L, as described previously with reference to FIGS. 1 and 2. In other words, there is no HR coated facet(s). Conversely, in a second set 600 of FIG. 6, HR facets are included in back-to-back flared BAL optical cavities, as described previously with reference to FIGS. 3 and 4. Set 600 also shows rectangular end apertures 606 to facilitate cleaving, as described with reference to FIGS. 9A, 9B, and 9C of U.S. Pat. No. 9,166,369 of Kanskar, titled "Flared Laser Oscillator Waveguide," filed Aug. 27, 2013 by nLIGHT, Inc.

In both sets 500 and 600, opposing PR-coated emitters have width "A" bearing different subscript numbers to clarify that the various "A" dimensions need not be identical for each embodiment. In some embodiments, output apertures "A" on opposing faces may have different widths (i.e., asymmetrical widths). Furthermore, "a" (also bearing subscripts) is the narrowest width at inner transition boundaries 206, i.e., virtual boundaries 216 and 218 (FIG. 2) and physical boundaries 416 and 418 (FIG. 4).

On each side of the boundaries, tapering is established because "A" is greater than "a." Moreover, members of each sets 500 and 600 include straight, concave, and convex shapes of tapered lateral waveguide. Additional details on the different types and combinations of shapes are set forth with reference to the table of FIG. 22 and FIG. 7, which show curved, including s-shaped, REM designs that are simplified by showing only half of a bidirectional design.

Figure 7:
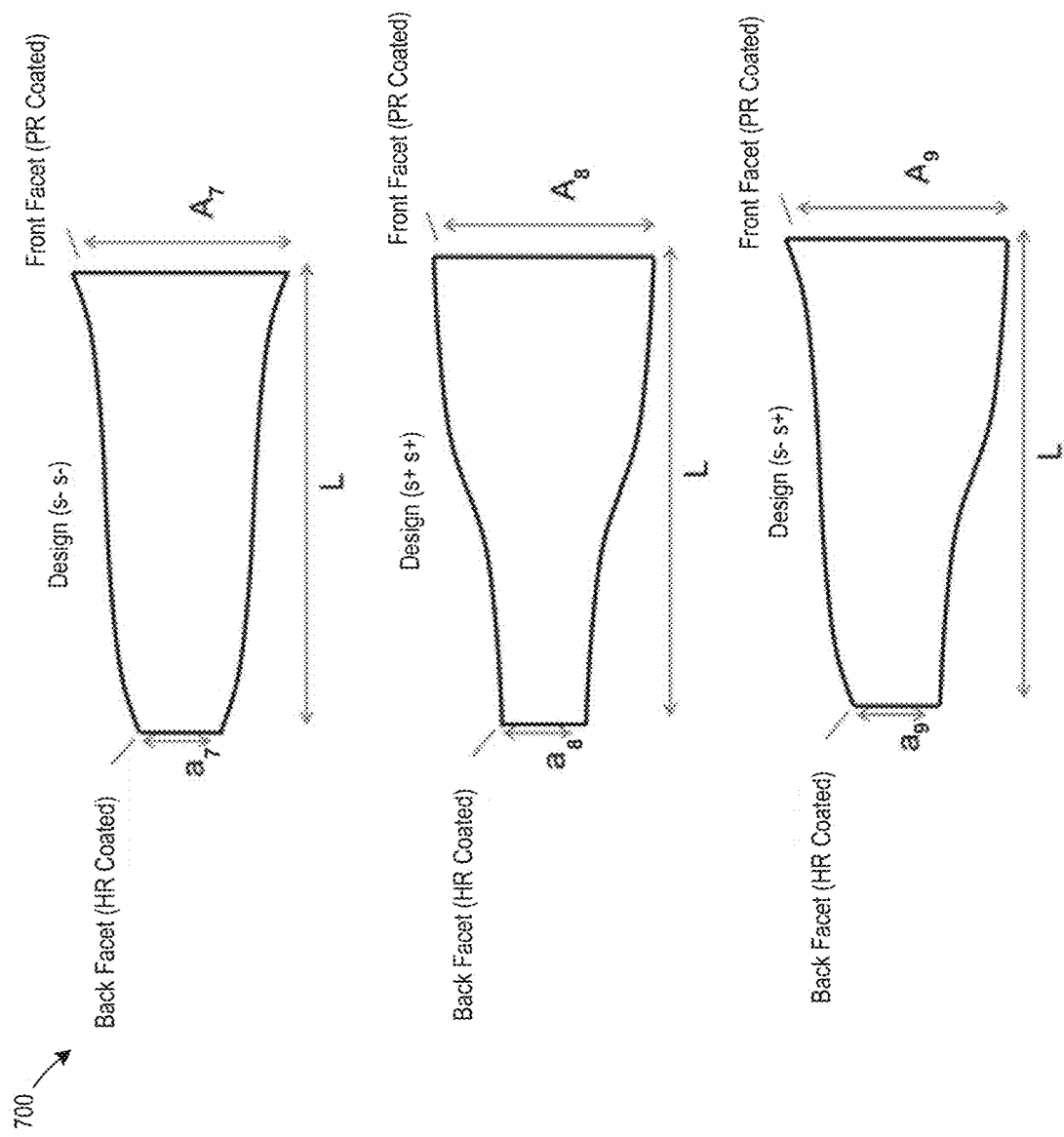
FIG. 7 is a set of three top plan views showing right-hand sides of bidirectional, FLOW optical cavity designs, according to other embodiments having "S" curved lateral waveguide boundaries.

In the table, the "Left" column lists available tapering shapes of a first lateral waveguide boundary. Likewise, the "Right" column lists shapes of a second lateral waveguide boundary that confronts the first lateral waveguide boundary. For example, each left- and right-hand half of the first embodiments of FIGS. 5 and 6 has straight tapered lateral waveguide boundaries denoted as (00) in the table. Each half of the second embodiments of FIGS. 5 and 6 has concave tapered lateral waveguide boundaries denoted as (++) in the table. And each half of the third embodiments of FIGS. 5 and 6 has convex tapered lateral waveguide boundaries denoted as (−−) in the table. In additional to these shapes, "S" curves and other shapes also contemplated. For example, FIG. 7 shows a set 700 of three right-hand sides of, respectively, negative "S" curve (s− s−), positive "S" curve (s+ s+), and combination "S" curve (s− s+) designs.

Skilled persons will appreciate that a BEST laser architecture waveguide may be asymmetrical about its central plane. For example, a straight-tapered (00) design (or other design) of a first half is combinable with a second half having a different design to form a BEST laser architecture that is asymmetrical about the central plane. Moreover, the (s− s+) variant of FIG. 7 provides an example of a design that is asymmetrical about a longitudinal plane, orthogonal to a central plane.

Figure 8:
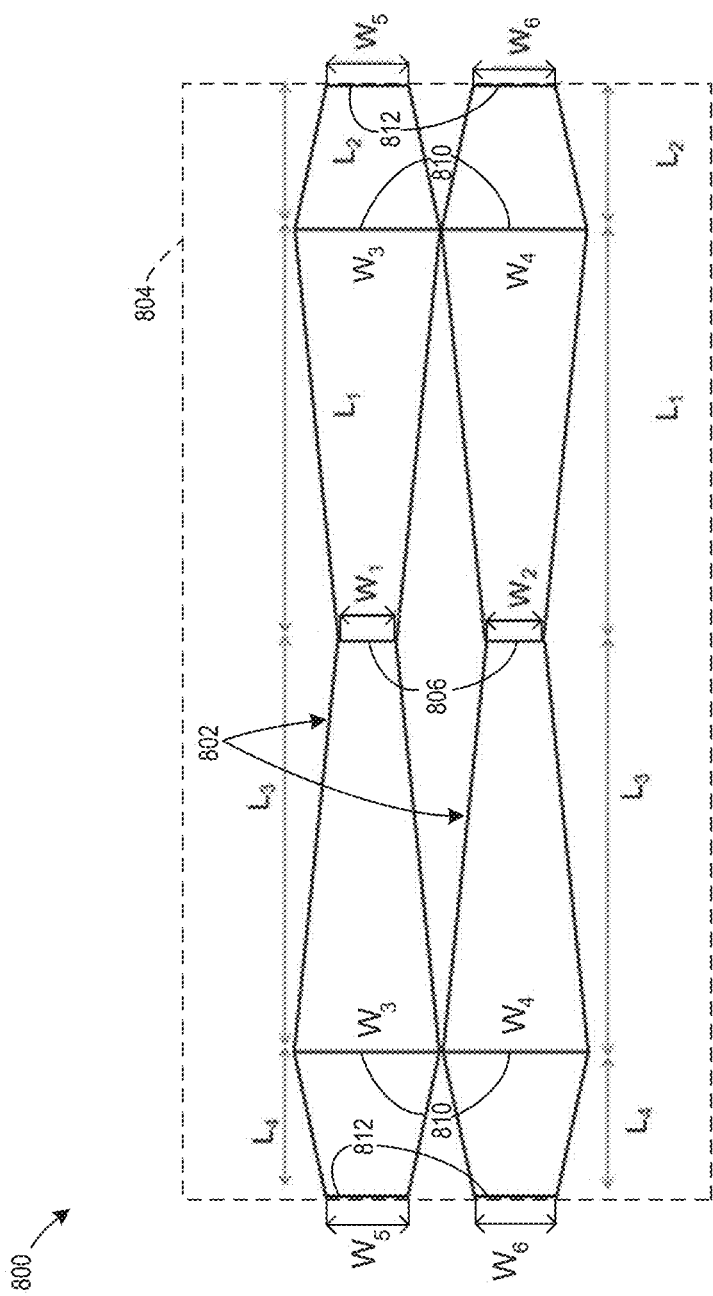
FIG. 8 is a top plan view of a pair of bidirectional FLOW optical cavities including multiple tapered segments.

Skilled persons will also appreciate that various other shapes of tapers are possible, such as those described for unidirectional laser diodes in the '369 patent. For example, FIG. 9A of the '369 patent shows a unidirectional FLOW embodiment having multiple taper segments. A similar multi-segment shape may be employed for bidirectional embodiments that are the subject of the present disclosure. For example, FIG. 8 shows a multi-segment, bidirectional n-REM embodiment 800 in which there is a side-by-side pair of bidirectional optical cavities 802 in a laser diode 804. The "n" in n-REM implies multiple devices and FIG. 8 shows two, i.e., n equals two, although skilled persons will appreciate that n could equal three, four, or more devices as described in U.S. patent application Ser. No. 14/879,515 of Kanskar, titled "Multiple Flared Laser Oscillator Waveguide," filed Oct. 9, 2015 by nLIGHT Photonics Corp. (now named nLIGHT, Inc.).

Each one of cavities 802 increases in width along lengths $L_1/L_3$, from narrowest widths $W_1/W_2$ at an inner transition boundary 806 to widest widths $W_3/W_4$ at intermediate transitional boundary 810, and then decreases in width along lengths $L_2/L_4$ to facet widths $W_5/W_6$ at outer faces 812. In some embodiments, narrower and intermediate widths are the same or different. For example, $W_1$ may be equal to other widths such as $W_2$ or $W_5$. Likewise, the lengths may also be varied.

The various forms of tapering act as first and second higher order mode suppression structures 240, 242 (FIG. 2) for enhancing device performance. More generally, and irrespective to specific tapering shapes, the aforementioned FLOW/REM designs include higher order mode suppression structures in the form of a narrower region of a waveguide body that is centrally located (i.e., proximal the inner transition boundary) vis-à-vis a wider region toward the front faces. These designs, therefore, offer an additional advantage of addressing effects of (long-range) LSHB in edge-emitting semiconductor lasers.

The effect of LSHB stems from the inhomogeneous distribution of carrier density, and therefore optical gain, along the laser axis, caused by the inhomogeneous lasing light intensity distribution in the longitudinal direction, i.e., the cavity length direction. It is in practice most pronounced in lasers of an asymmetric design, common in high-power lasers, where one mirror is antireflection (AR) coated and the other mirror is HR coated. It is thus distinct from short-range spatial hole burning, which is due to the standing wave pattern of the laser mode and the associated variation of carrier density on the spatial scale of the laser wavelength and is more weakly-dependent on the mirror reflectances. Past work has focused on semiconductor laser devices, commonly known as the BALs, which have a fixed emitter width along the length of the laser cavity. As a result, past work has focused on reducing LSHB by using nearly or identically symmetric partial reflectors to keep the longitudinal photon density along the cavity on the average the same and not drastically asymmetric like in HR/AR coated BALs. However, this technique does not address the lateral dimension since the devices have a constant width. So, tailoring the linear current density along the cavity length by introducing patterned injection-current on rectangular shaped BALs has been employed to provide more current near the output facet to befit the longitudinal photon density. Unfortunately, this technique introduces higher series resistance due to smaller contact area and suffers from lower efficiency. Furthermore, it is not possible, for instance, to achieve two-fold increase in current near the front facet.

Bidirectionally emitting FLOW/REM devices address the LSHB issue by including lateral waveguide widths that gradually increase as the extend longitudinally from (and are optionally symmetrical about) the center of the laser cavity towards relatively wider bidirectional facets, according to the various shapes of tapering functions described in previous paragraphs. The gradually increasing lateral waveguide widths are used to expand the optical mode to compensate the normally near-exponential increase of photon density, therefore reducing the gain saturation in the device. As a result, the injected current per unit length along the laser cavity also increases from the center towards the output facets and befits the photon density more so than for devices with constant width along the cavity length. BALs using only symmetric output partial reflectors still suffer from LSHB with photon density at the output facet typically two times higher compared to the center of the cavity when 10% partial reflection is used. Employing varying width along the cavity symmetric about the center of the cavity helps to mitigate LSHB not only by balancing the photon density but also by providing more carriers towards the output facets.

HOMSL in BEST Laser Architecture

As described in U.S. patent application Ser. No. 15/796,355 of Kanskar et al., titled "Method, System and Apparatus for Higher Order Mode Suppression," filed Oct. 27, 2017 by nLIGHT, Inc., a HOMSL device includes an index guiding aperiodic structure comprising high- and low-index materials with high loss in the high index material, which disproportionately overlaps higher order modes compared to lower order/fundamental modes. The low-index material has an index of refraction that is lower than the effective index of refraction of the lateral waveguide, and the high-index material has an index of refraction that is higher than the effective index of refraction of the lateral waveguide. The average index of refraction of the HOMSL device may be lower than the modal index, so that the HOMSL device is in the index guiding regime instead of anti-guiding, but the locally high index areas pull in the electric field or intensity and interact with the material locally and introduce high loss to the higher order modes.

Figure 9:
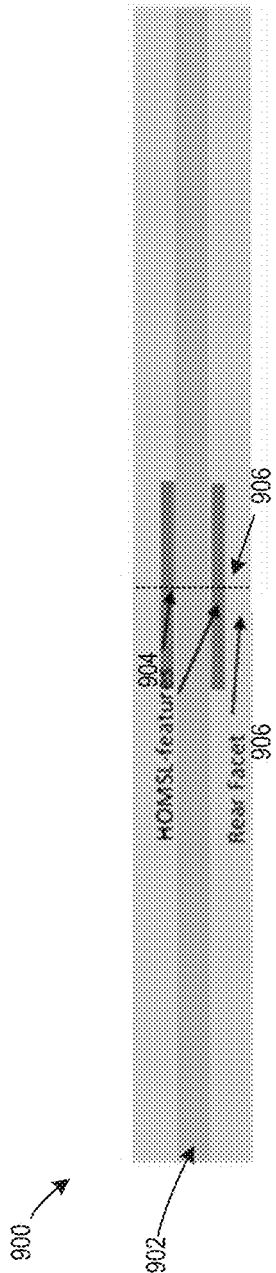
FIGS. 9 and 10 are top plan views of, respectively, non-flared and flared optical cavity and high-index region designs of higher-order mode suppressed laser (HOMSL) devices.
Figure 10:
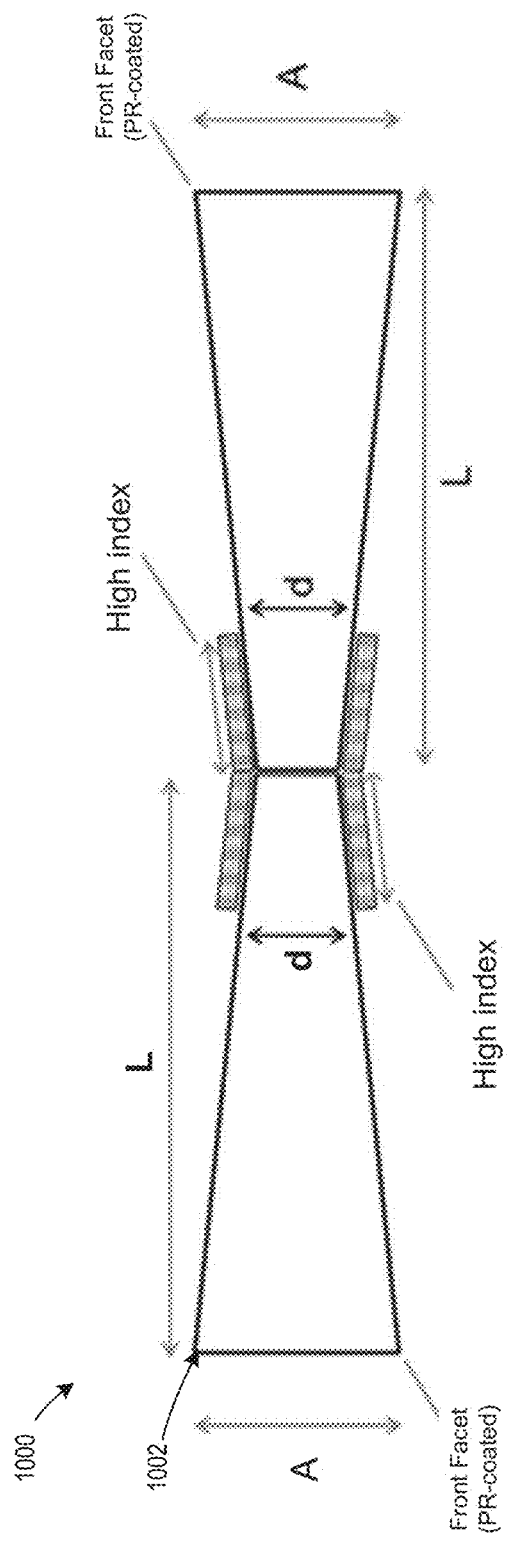

FIGS. 9 and 10 show two embodiments of bidirectional HOMSL devices. A first, HOMSL device 900 of FIG. 9 shows a non-tapered lateral waveguide body 902 featuring high-index features 904 extending from rear HR facets 906. High-index features 904 act as the high order mode suppression features described previously with reference to FIGS. 1-4. The index of refraction of high-index features 904 is higher than that of non-tapered lateral waveguide body 902 (i.e., high-index features 904 are configured to introduce differentially more loss to higher order modes thereby suppressing them in the lateral (i.e., orthogonal to propagation) direction. Inclusion of this buried or surface high index material disproportionately selects higher order modes that overlap with the high index material compared to lower order modes/fundamental mode. Additional description of the materials, placement, and attributes of high-index features 904 appears in the '355 application for unidirectional devices, although the techniques are also applicable in the BEST laser architecture. For example, FIG. 9 of the '355 application shows a high-index region on one lateral side instead of on both sides.

A second, HOMSL device 1000 of FIG. 10 is similar to HOMSL device 900 of FIG. 9, but device 1000 also incorporates a tapered waveguide body 1002 as described previously.

LODSL in BEST Laser Architecture

U.S. patent application Ser. No. 16/001,734 of Chen et al., titled "Low Divergence High Brightness Broad Area Lasers," filed Jun. 6, 2018 by nLIGHT, Inc., describes various unidirectional LODSL devices including two-step or variable gain-guided and index-guided hybrid structures, e.g., non- or less-etched gain-guided lateral waveguide portions disposed closer toward an HR facet (or an inner transition boundary of a bidirectional device), which are generally referred to in this disclosure as higher order mode suppression structures. These structures suppress higher order modes and perforce reduce a divergence angle $\theta_1$ (FIG. 12) compared to a wider angle $\theta_2$ (FIG. 12) of conventional BALs having some similar geometrical (e.g., emitter/reflector widths, cavity length, etc.), epitaxial (e.g., doping levels, carrier concentrations, layer thicknesses, etc.), and operational characteristics (e.g., pumping levels).

In the context of unidirectional devices, though also applicable for bidirectional ones, the '734 application explains how varying refractive index step along a cavity length for a lateral waveguide, with lower refractive index step (delta n, or $\delta n$) towards a back facet and higher $\delta n$ towards the front facet is achieved by, for example, using grooves with varying depths and shapes along a cavity length so as to effectively vary refractive index step for ridge waveguide. Groove widths, defined by photolithography, can be used to control the etching rate, so that longitudinally varying groove width leads to longitudinally varying groove etch depth.

FIG. 11, for example, shows a bidirectional LODSL device 1100 emitting output beams 1102 having a reduced slow axis divergence angle based on a variable lateral refractive index profile along a laser diode length so as to suppress, or assist with the suppression of, higher order modes (see e.g., FIGS. 2A and 2B of the '734 application). Bidirectional LODSL device 1100 includes a waveguide body 1104 comprised of a pair of Fabry-Perot cavities 1106, 1108 formed along a longitudinal axis 1110 between HR facets 1112, 1114 confronting at an inner transition boundary 1116 and opposing PR facets 1118, 1120. In another embodiment, a single bidirectional cavity (not HR facets) is possible. Also, cavities 1106, 1108 may be laterally offset from each other along different longitudinal axes (as shown in, e.g., FIG. 4).

Bidirectional LODSL device 1100 may be formed in various geometries and configurations, and include various arrangements of p-type, n-type, active, cap, and dielectric layers. On a more general level, bidirectional LODSL device 1100 includes an n-type clad layer 1130 and an p-type clad layer 1132 between which cavities 1106, 1108 are defined by an n-type waveguide layer 1134, a p-type waveguide layer 1136, and an active layer 1138 between n- and p-type waveguide layers 1134, 1136. Active layer 1138 typically includes multiple quantum wells, but other configurations are possible, including p-n junction homostructures, heterostructures, double-heterostructures, single quantum wells, quantum wires, quantum dots, and other configurations. As shown and described in the '734 application, p-type clad layer 1132 can be etched into various shapes to form ridge structures or mesas. Dielectric, cap, or both layers can be formed to guide current through active layer 1138.

HR facets 1112, 1114 are typically cleaved semiconductor facets coated with a highly reflective coating, so as to provide optical reflectivity in a wavelength range of interest, corresponding to a lasing wavelength of bidirectional LODSL device 1100. The optical reflectivity is typically in the range of 50%, 80%, 90%, 95%, 99%, 99.9%, 99.99%, or greater, and more typically at least 90% so as to increase a power efficiency in the generation of the output beams 1102.

PR facets 1118, 1120 are also typically cleaved semiconductor facets coated with an anti-reflectivity coating that provides a partial reflectivity that is selected in relation to the desired gain characteristics bidirectional LODSL device 1100. LODSL device 1100 has HR facets (i.e., as described with reference to FIG. 4), in which case PR facets 1118, 1120 can provide a reflectivity in the ranges shown in FIG. 4 or in the ranges described in the '734 application (e.g., a range of less than or equal to 40%, 20%, 10%, 5%, 2%, 0.5%, and so forth) depending on the particular implementation. For single cavity devices lacking HR facets, such as the embodiment described with reference to FIG. 2, the range extends up to 50% reflectivity.

Instead of a conventional cavity being index-guided by a lateral refractive index profile that remains constant along a full length of a lateral waveguide, lateral waveguides 1140, 1142 define a lateral refractive index profile that longitudinally varies. The profile varies because lateral waveguides 1140, 1142 include ridge waveguide portions 1146, 1148 and centrally located (weakly guiding) lateral waveguide portions 1150, 1152. The ridge waveguide portions 1146, 1148 are proximal PR facets 1118, 1120. The lateral waveguide portions 1150, 1152 are proximal HR facets 1112, 1114 (or, more generally, proximal an inner transition boundary).

Ridge waveguide portions 1146, 1148 are each formed by a pair of lateral index guiding elements 1154, 1156 extending a predetermined distance into cavities 1106, 1108. The predetermined distance may be deeper or shallower and may vary longitudinally, as shown in some embodiments of the '734 application. For example, the longitudinal length of index-guiding elements 1154, 1156 is less than the full length of cavities 1106, 1108 to establish a stepped index, but other embodiments may include a gradient index etched partly or fully along the length.

A current aperture 1160 of a metal contact stripe or cap layer stripe 1162 extending along a top surface 1166 of bidirectional LODSL device 1100. Stripe 1162 typically extends the full length of bidirectional LODSL device 1100, though less than the full length or separated stripe portions can be defined, for example, so as to provide separate electrically pumped contact areas. In some configurations, stripe 1162 can be defined in relation to adjacent shallow depressions (e.g., by etching) extending the length of LODSL device 1100. In another embodiment, stripe 1162 is situated in a raised ridge configuration extending the length of bidirectional LODSL device 1100 relative to adjacent portions of p-type clad layer 1132, so as to introduce a weak refractive index difference guide along the length of bidirectional LODSL device 1100.

Stripe 1162 is electrically coupled to an electrical source (e.g., with electrical leads or additional metal layers or contacts) so that lateral waveguide portions 1150, 1152 are gain-guided at low current and become weakly index-guided at high current where higher optical field strengths and local temperature gradients produce thermal lensing and local increases in refractive index. The amount of decrease of the lateral refractive index profile difference δn is sufficient to reduce the number of supported lateral optical modes, as described in the '734 application.

Skilled persons will appreciate bidirectional LODSL embodiments may include more than two index difference steps along a length of a waveguide. Likewise, skilled persons will appreciate that other symmetric or asymmetric profiles of unidirectional embodiments described in the '734 application are suitable for use in bidirectional embodiments. For example, FIG. 12 shows a bidirectional LODSL device 1200 that includes a waveguide body 1202 encompassing a single optical cavity situated below a current injection contact 1204. The cavity extends bidirectionally along a longitudinal axis 1206 between an inner transition boundary 1208 and PR facets 1210, 1212 emitting output beams 1214.

Two pairs of refractive index elements 1220, 1222 assist with defining a longitudinally varying lateral refractive index profile for waveguide body 1202. End portions 1224, 1226 of elements 1220, 1222 curve laterally outward away from a longitudinal axis 1230 so as to provide a smooth modal transition between a central lateral gain-guided region 1232 and distal lateral index-guided regions 1240. While the end portions 1224, 1226 are shown to be curved, other shapes are possible including straight, segmented, or other shapes. The curvature or other geometry is selected so as to reduce or minimize coupling loss and to suppress coupling of a cladding beam propagating in gain-guided region 1232 into index-guided regions 1240.

Figure 13:
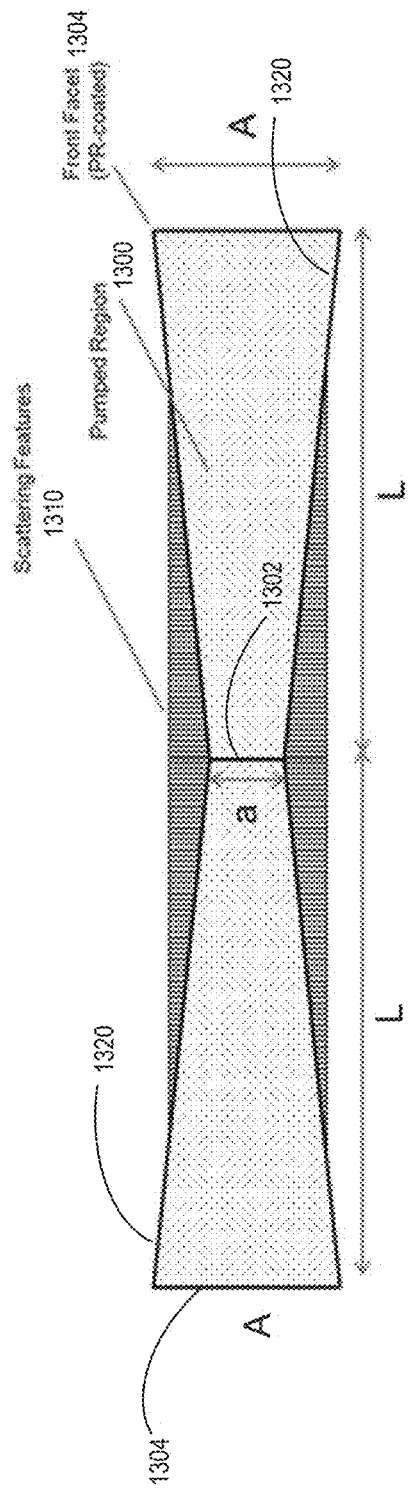
FIGS. 13-21 are top plan views of optical cavity designs including scattering features, distributed feedback (DFB) grating, distributed Bragg reflection (DBR) grating, or grating combinations thereof for bidirectional FLOW devices.
Figure 14:
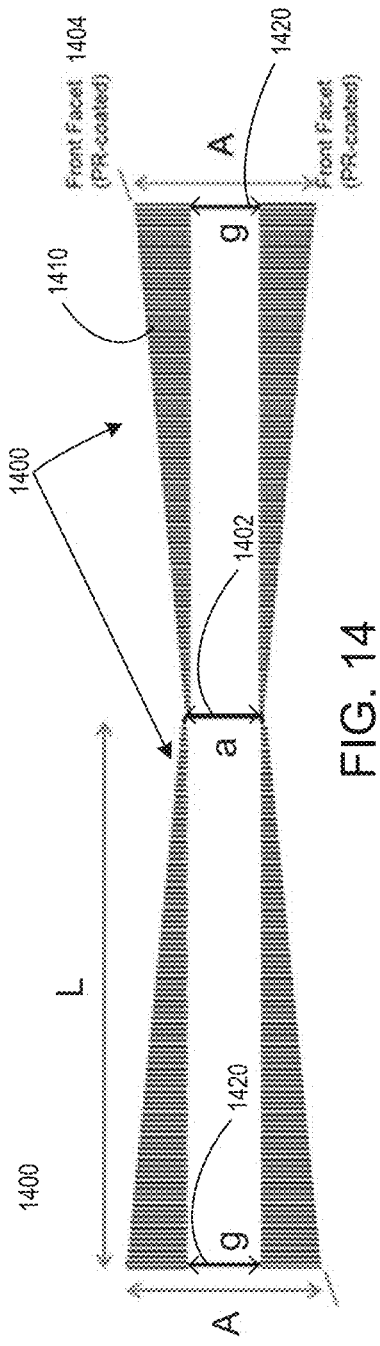

Supplemental Higher Order Mode Suppression Structures in BEST Laser Architecture FIGS. 13 and 14 show top cross-sectional views of additional embodiments of flared laser oscillator waveguide devices in accordance with aspects of the present disclosure.

In FIG. 13, a flared current injection (i.e., pumped) region 1300 is shown extending between an inner transition boundary 1302 having a width 'a' and partial reflecting front facets 1304 having a width CA. A pair of scattering elements 1310 is oppositely positioned in current injection region 1300 and partly extends between inner transition boundary 1302 and front facets 1304. Scattering elements 1310 each have a slightly wider width toward inner transition boundary 1302 and reduce in width toward front facets 1304 such that portions 1320 toward front facets 1304 do not have scattering elements 1310 associated therewith.

In FIG. 14, a flared current injection region 1400 is shown extending between an inner transition boundary 1402 having a width 'a' and partial reflecting front facets 1404 having a width 'A'. A pair of scattering elements 1410 is oppositely positioned in current injection region 1400 and extends between inner transition boundary 1402 and front facets 1404. Scattering elements 1410 each have a selected width with respect to the width 'A' such that a portion 1420 of each front facet 1404 does not have scattering elements 1410 associated therewith and has a width 'g' that is narrower than width 'A.'

More generally, various scattering patterns, such as the examples shown in FIGS. 13 and 14, are defined in flared laser oscillator waveguide devices in order to introduce loss of higher order modes of laser light propagating therein for improved beam output. While different geometric examples are described, the scattering patterns can generally be configured to overlap the modal content of the laser light to achieve higher order mode suppression. Scattering patterns can be formed in a variety of ways to realize mode-stripping effects, including the non-resonant grating, formation of micro-structures that include features with index contrast, or formation of a second-order grating, in the selected patterned area. Additional details of unidirectional embodiments including scattering features are described with reference to FIGS. 11A, 11B, and 11C of the '369 patent.

Figure 15:
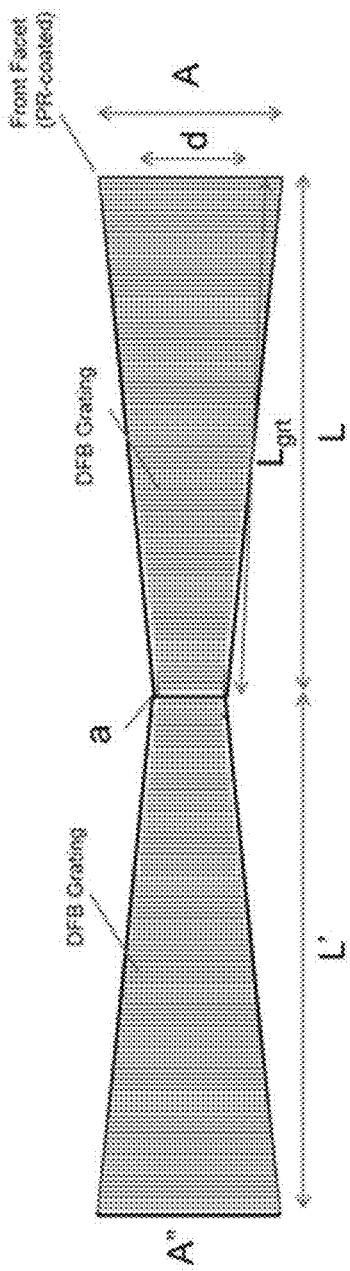
Figure 16:
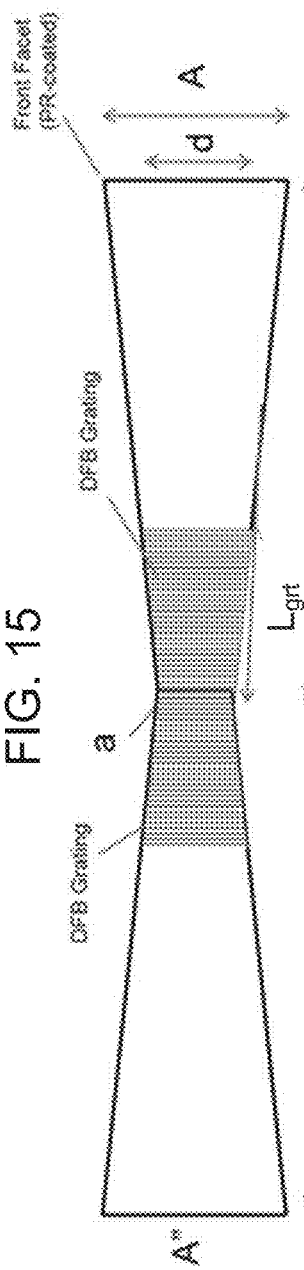
Figure 17:
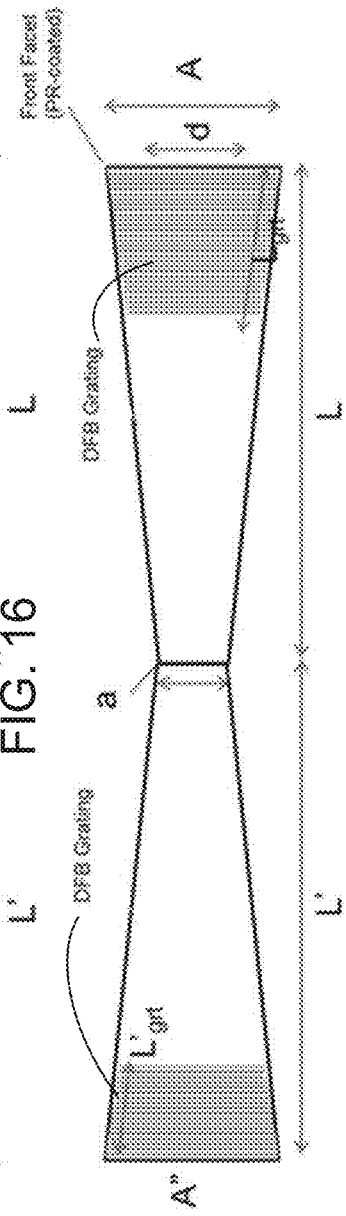
Figure 18:
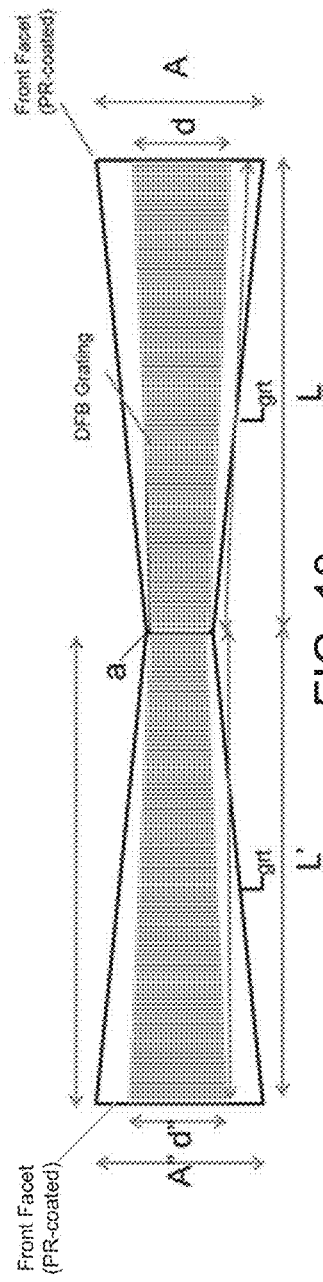

FIGS. 15-17 show top cross-sectional views of current injection regions of flared laser oscillator waveguide devices, in which DFB gratings disposed at various locations in current injection regions. Each embodiment is annotated to identify the current injection region extending between an inner transition boundary having a width 'a' and partial reflecting front facets having a width 'A.' DFB gratings are disposed in the flared current injection region coextensive with the pumped area of the diode (FIG. 15), partly coextensive with the pumped area toward the inner transition boundary (FIG. 16), and partly coextensive with the pumped area toward its front facets (FIG. 17). These variants provide for different wavelength locking functionality, such as locking strength, coupling constant, and efficiency. Additional details of a unidirectional variant is described with reference to FIG. 12A of the '369 patent.

Figure 19:
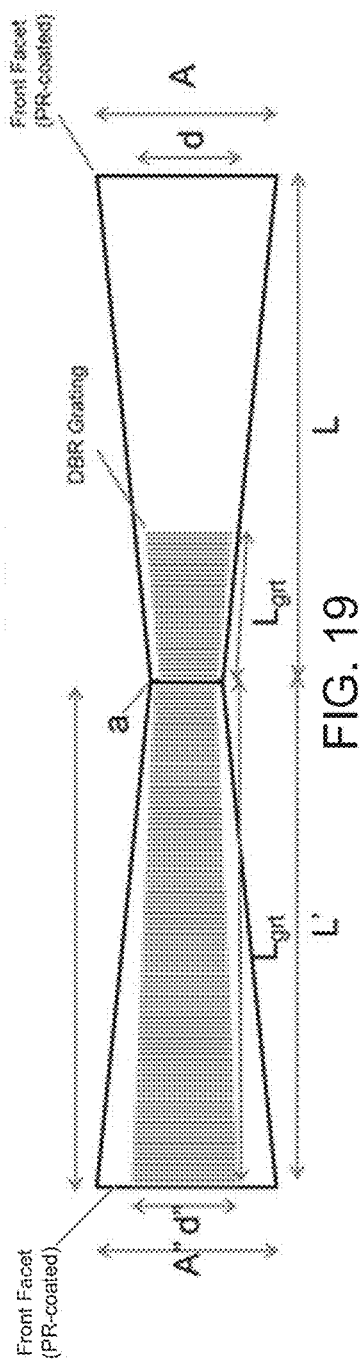
Figure 20:
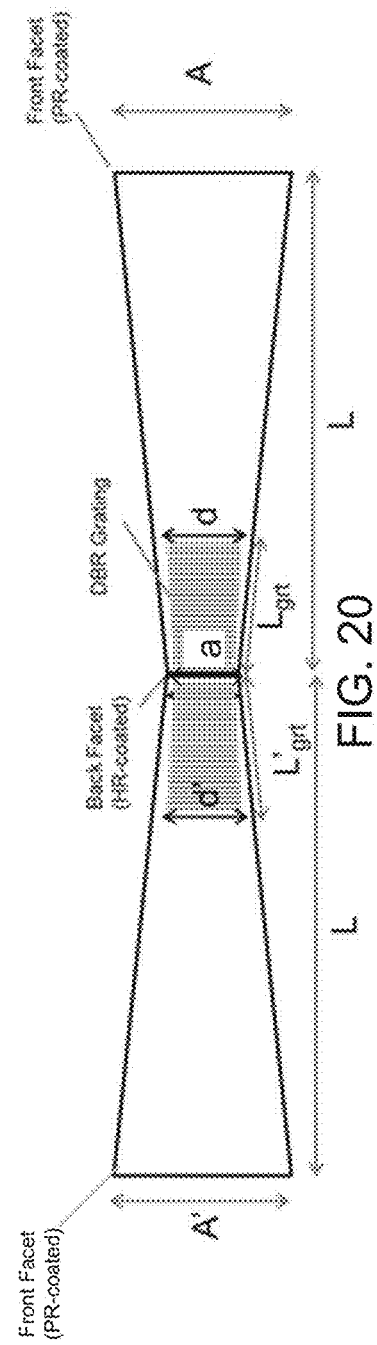

FIGS. 18-21 also show top cross-sectional views of current injection regions of flared laser oscillator waveguide devices, in which DBR gratings disposed at various locations in current injection regions. Each embodiment is annotated to identify the current injection region extending between an inner transition boundary having a width 'a' and partial reflecting front facets having a width 'A.' For example, FIG. 20 shows a grating extends the width 'a' of an inner transition boundary, extends a length 'Lgrt' along the longitudinal axis of the device, and extends to a width 'd' inside the region. As can be seen from FIG. 20, the width of 'd' need not be equal to 'a'. In most cases d>a and the width of 'd' can stretch all the way to the lateral dimension of the pumped region at the location where Lgrt ends. In some examples, the area of the grating is electrically-pumped with current during operation. The length of the distributed Bragg reflector grating is selected to provide high reflectivity (>9%). Additional details of a unidirectional variant are described with reference to FIG. 12B of the '369 patent.

Figure 21:
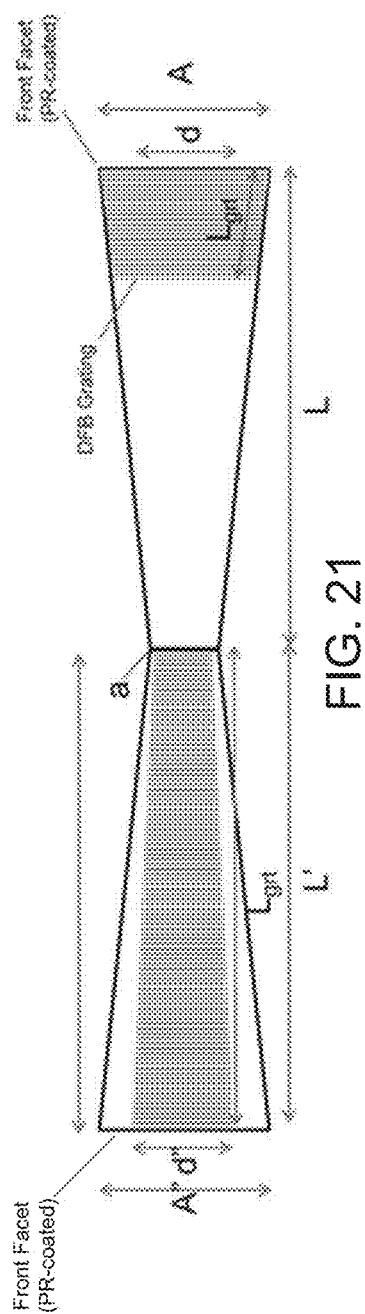

Skilled persons will appreciate that many changes may be made to the details of the above-described embodiments without departing from the underlying principles of the invention. For example, skilled persons will appreciate that, as shown in FIGS. 19 and 21, the arrangement of DBR (or for that matter, DFB or scattering elements) need not be symmetric in a BEST device. Also, the scattering features, DFB gratings, DBR gratings, and combination thereof shown in FIGS. 13-21 may also be used to enhance BEST devices including (n-)REM, LODSL, FLOW, HOMSL, and other technologies of nLIGHT, Inc. The scope of the present invention should, therefore, be determined only by the following claims.

The invention claimed is:

1. A semiconductor broad area laser diode device for bidirectional multimode emission of first and second laser beams along opposite propagation directions, the semiconductor broad area laser diode device comprising:
    a waveguide body having first and second portions and one or more optical cavities, each of the first and second portions of the waveguide body including an outer face and an inner transition boundary between the first and second portions, the outer faces of the first and second portions including, respectively, first and second partial reflector (PR)-coated laser output facets facing in opposing directions on opposite sides of the waveguide body for the bidirectional multimode emission of the first and second laser beams from the one or more optical cavities, and the inner transition boundaries of the first and second portions disposed adjacent to each other and to a central plane dividing the first and second portions along a longitudinal length of the waveguide body; and
    first and second higher order mode suppression structures formed in the waveguide body and extending away from the inner transition boundaries in a direction along the longitudinal length, each of the first and second higher order mode suppression structures disposed along at least a corresponding portion of the waveguide body so as to impart intensity control, beginning at the inner transition boundaries and differing longitudinally with respect to that imparted toward the outer faces, of a mode profile that is lateral to the opposite propagation directions of the first and second laser beams, thereby facilitating enhanced slow axis brightness.

2. The semiconductor broad area laser diode device of claim 1, in which the one or more optical cavities comprise first and second optical cavities, and the first and second portions of the waveguide body are spaced apart from each other such that the inner transition boundaries comprise confronting high reflector (HR)-coated facets proximal the central plane, the first optical cavity located between the first PR-coated laser output facet and a first HR-coated facet of the first portion, and the second optical cavity located between the second PR-coated laser output facet and a second HR-coated facet of the second portion.

3. The semiconductor broad area laser diode device of claim 1, in which the one or more optical cavities comprise a single optical cavity extending between the first and second PR-coated laser output facets.

4. The semiconductor broad area laser diode device of claim 1, in which the waveguide body comprises a bidirectional flared laser oscillator waveguide (FLOW), and in which the first and second higher order mode suppression structures comprise, respectively, first and second flared current injection regions.

5. The semiconductor broad area laser diode device of claim 1, in which the first and second higher order mode suppression structures comprise, respectively, higher order mode suppression layers (HOMSLs).

6. The semiconductor broad area laser diode device of claim 1, in which the first and second higher order mode suppression structures comprise a lateral refractive index profile that varies along the longitudinal length of the waveguide body.

7. The semiconductor broad area laser diode device of claim 1, in which the first and second portions are structurally symmetric about the central plane.

8. The semiconductor broad area laser diode device of claim 1, in which the first and second higher order mode suppression structures comprise non- or less-etched gain-guided lateral waveguide portions.

9. The semiconductor broad area laser diode device of claim 1, further comprising distributed feedback (DFB) gratings in the one or more optical cavities.

10. The semiconductor broad area laser diode device of claim 1, further comprising distributed Bragg reflection (DBR) gratings in the one or more optical cavities.

11. A chip on submount device including:
    an electrical submount; and
    the semiconductor broad area laser diode device of claim 1, electrically coupled to the electrical submount.

12. An assembly including a heat sink carrying the chip on submount device of claim 11.

* * * * *